(12) United States Patent
Gulvin et al.

(10) Patent No.: US 6,465,856 B2
(45) Date of Patent: Oct. 15, 2002

(54) MICRO-FABRICATED SHIELDED CONDUCTORS

(75) Inventors: Peter M. Gulvin, Webster, NY (US); Jingkuang Chen, Rochester, NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/812,498

(22) Filed: Mar. 19, 2001

(65) Prior Publication Data

US 2002/0130916 A1 Sep. 19, 2002

(51) Int. Cl.[7] .............................................. H01L 29/82
(52) U.S. Cl. ..................... 257/422; 257/414; 257/421
(58) Field of Search .................................. 257/414, 417, 257/422, 431, 345, 421

(56) References Cited

U.S. PATENT DOCUMENTS 6,012,336 A * 1/2000 Eaton et al. ................... 73/754
6,174,820 B1 * 1/2002 Habermehl et al. ......... 438/745

* cited by examiner

*Primary Examiner*—Richard Elms
*Assistant Examiner*—Brad Smith
(74) *Attorney, Agent, or Firm*—Oliff & Berridge, PLC; Eugene O. Palazzo (57) ABSTRACT

A microstructure that may be used as an electrical connection in a microfabricated electro-mechanical system (MEMS) apparatus. The microstructure may have one or more isolatable electrical connections for signal transmission. The microstructure allows a MEMS apparatus to shield signal transmissions from the effects of electromagnetic interference or conductive fluids.

17 Claims, 7 Drawing Sheets

MICRO-FABRICATED SHIELDED CONDUCTORS

BACKGROUND ON THE INVENTION

The present invention generally relates to Micro-Electro-Mechanical Systems (MEMS), and more particularly, relates to a MEMS microstructure having a shielded conductive path.

Micro-Electro-Mechanical Systems (MEMS) is the integration of mechanical elements, sensors, actuators, and electronic elements onto a common substrate through the utilization of micro-fabrication technology. As a result, smarter products can be developed because a MEMS apparatus makes possible the realization of a complete electro-mechanical system on a substrate. The resulting elector-mechanical systems are smaller, lighter, more functional, less expensive to manufacture, and more reliable than conventional elector-mechanical systems. Because of these benefits, MEMS are being employed in applications that require the MEMS to sense and control the local environment. The sensor elements of the MEMS are able to gather information from the environment through the measure of thermal, biological, chemical, optical, and magnetic phenomena. While the control elements of the MEMS apparatus are able to process the gathered information to control the local environment for a desired outcome or purpose.

One such environment requires the MEMS apparatus to be in contact with a conductive fluid, such as conductive ink. As a result, the conductive paths of the MEMS apparatus are prone to electrical shorting. The conventional technique to prevent electrical shorting of the conductive paths in contact with conductive fluids is to encapsulate the conductive paths with a dielectric material such as polyimide. Although polyimide offers adequate insulation properties, it is often desirable to add an additional layer of protection between the conductive fluid and the conductive paths of the MEMS apparatus. For example, polyimide is used in the art of inkjet printhead technology to form an ink holding cavity and to insulate the conductive paths leading to an inkjet ejector. However, the conductive paths leading to an inkjet ejector lie directly below the ink holding cavity formed by the polyimide. Consequently, the polyimide that forms the ink holding cavity also acts as the insulator that prevents an electrical short between the conductive path and the conductive fluid. Hence, a single point breakdown in the polyimide results in failure of the inkjet printhead.

Moreover, a layer of insulating material such as polyimide provides no protection from Electromagnetic Interference (EMI). As a result, the MEMS are susceptible to EMI and may produce an undesired or unwanted response, cease to function, or exhibit a degradation of performance. Because a sudden change in voltage or current in a transmitted signal may cause EMI, neighboring conductive paths are especially susceptible.

Consequently, the conductive paths of a MEMS apparatus are susceptible to EMI from neighboring conductive paths and from other EMI sources operating in the proximity of the apparatus. The effects of EMI are more pronounced where the MEMS application requires the use of a high frequency modulated waveform. Since MEMS devices typically have high resonant frequencies, high frequency waveforms are a necessity to control and monitor the devices.

As a result, the layout of conductive paths in a MEMS apparatus becomes critical. But due to the miniaturized nature of a MEMS apparatus, the layout of conductive paths to avoid the effects of EMI from adjacent conductive paths and/or to avoid contact with conductive fluids in the envisioned operating environment is not always possible and exceedingly difficult. As a result, the growth of MEMS apparatuses in certain environments, for example, inkjet printheads, has been slowed.

SUMMARY OF THE INVENTION

The present invention addresses the above described limitations of conventional conductive paths in MEMS apparatuses. The present invention provides an approach to minimize the potential for electrical shorts in a MEMS apparatus that may contact a conductive fluid and provides an approach overcome a MEMS susceptibility to Electromagnetic Interference.

According to one aspect of the present invention, a method is practiced to form an electrical connection in a MEMS apparatus. Layers of conductive material and non-conductive material are interleaved to form an electrical connection having a center conductor and a shield.

According to another aspect of the present invention, a method is practiced to form an electrical connection in a MEMS apparatus. Layers of conductive material and non-conductive material are interleaved to form an electrical connection having a center conductor, a first shield and a second shield.

The present invention also provides a MEMS structure for shielding a conductive pathway in the MEMS apparatus, wherein the structure may include a first shield and a second shield for shielding the conductive pathway from adverse environmental phenomena in which a MEMS apparatus operates.

BRIEF DESCRIPTION OF THE DRAWINGS

An illustrative embodiment of the present invention will be described below relative to the following drawings.

DETAILED DESCRIPTION OF THE INVENTION

The present invention is directed to a shielded energy conductor for use in a microfabricated MEMS apparatus. Specifically, the present invention is directed to a MEMS microstructure and a method for implementing a shielded energy conductor into a MEMS apparatus. The MEMS microstructure is a solid state shielded conductor capable of providing the MEMS apparatus with protection against EMI and protection against contact with a conductive fluid. The method provides the steps that are taken during a MEMS micro-fabrication process to construct a shielded conductive path detailed below.

Generally, a MEMS apparatus is fabricated using a conductive path of polysilicon or a metallized conductive material, such as gold. During micro-fabrication, the conductive paths of the MEMS apparatus may be overlaid with a nonconductive sacrificial layer of oxide or nitride materiaL. These sacrificial layers are later removed to free the movable mechanical elements in the MEMS apparatus. With the sacrificial overlays removed, the conductive paths are susceptible to shorts from contact with a conductive fluid and are susceptible to electromagnetic interference from adjacent conductive paths or other electromagnetic phenomena.

For purposes of the discussion below it is helpful to clarify the meaning of the terms "conductive" and "conductor." The terms "conductive" and "conductor" as used herein are intended to include any suitable material that exhibits electrical conductivity. Examples of suitable materials include conductive metals, such as gold, silver, aluminum, and copper, conductive metal alloys, and any class of solids, such as germanium or silicon, that exhibit electrical conductivity.

Figure 1:
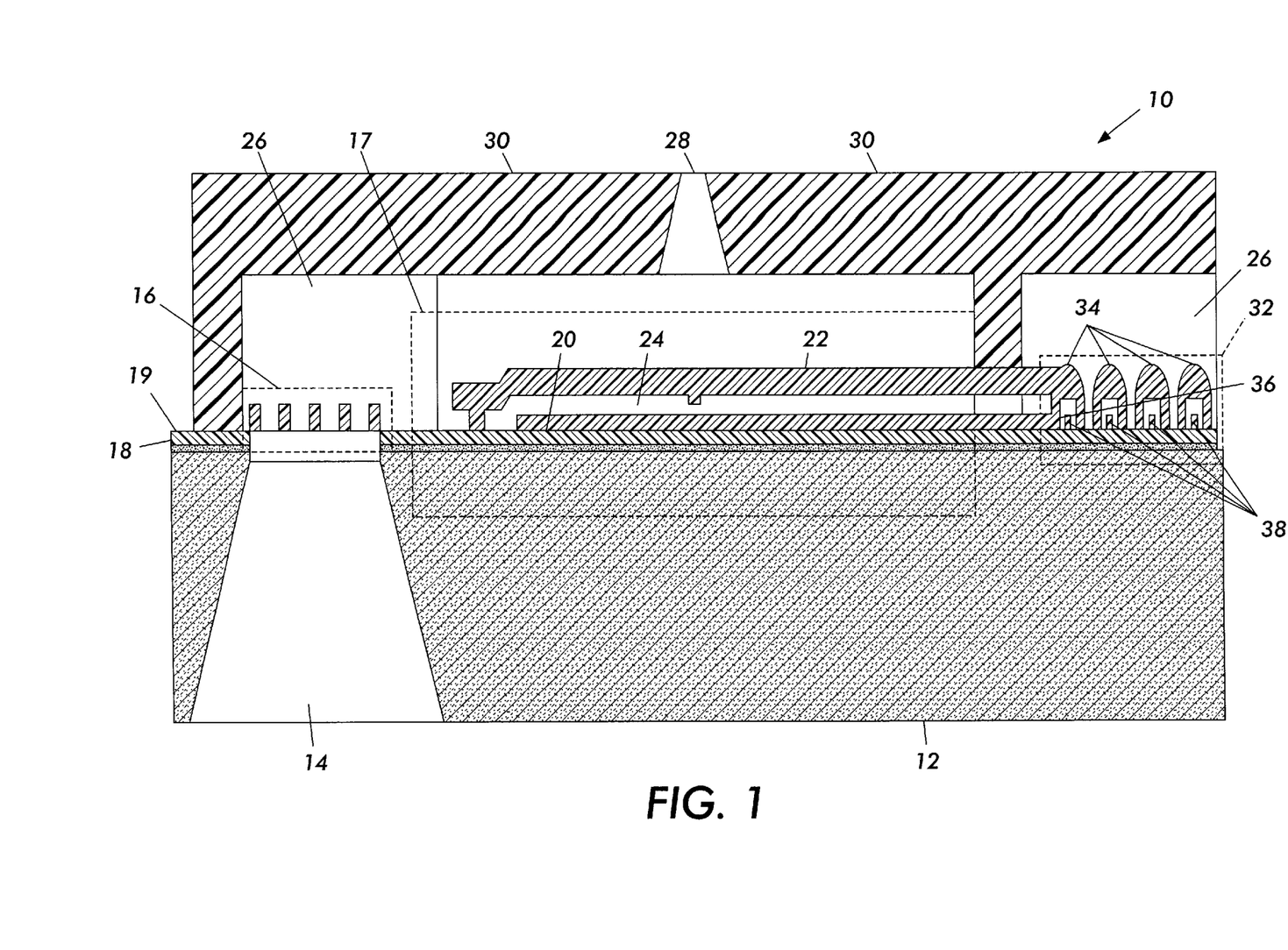
FIG. 1 illustrates a cross-sectional view of an inkjet printhead suitable employing the shielded conductor according to the teachings of the present invention.

FIG. 1 illustrates a cross section of an image forming system, such as an inkjet printhead 10, suitable for use with the present invention. The inkjet printhead 10 benefits from the additive micro-fabrication technique of the present invention, because the embedded control and data circuitry may be advantageously fabricated with a conductive shield to avoid the harmful effects of EMI and conductive ink. The inkjet printhead 10 is just one example of a Micro-Electrical-Mechanical System or MEMS apparatus with embedded control circuitry. One skilled in the art will realize that the methods and MEMS microstructure disclosed in the present invention are applicable to any MEMS device or apparatus manufactured using conventional micro-fabrication techniques and that the illustrative embodiment of an inkjet printhead in an image forming system is not meant to be limiting of the present invention. The microstructure is adapted to be used in any suitable system, such as an image forming system. An image forming system can include different technologies, such as electrophotographic, electrostatic, electrostatographic, ionographic, acoustic, and inkjets, such as a thermal inkjet, piezo inkjet, and micro-mechanical inkjet, and other types of image forming or reproducing systems that are adapted to capture and/or store image data associated with a particular object, such as a document, and reproduce, form, or produce an image.

The inkjet printhead 10 includes a base or supporting substrate 12 on which the MEMS apparatus is built. In this example, the supporting substrate 12 is a silicon material, however the supporting substrate 12 may be any material compatible with a micro-fabrication process, such as quartz, silicon nitride, and forms of aluminum oxide such as sapphire, diamond or gallium arsenate. A first insulation layer 18 of an oxide material such as silicon dioxide is thermally layered or grown on the substrate. Deposited and patterned on top of the first insulation layer 18 using a Low Pressure Chemical Vapor Deposition (LPCVD) technique is a second insulation layer 19 of a nitride material such as silicon nitride. One skilled in the art will recognize that other deposition techniques can also be used, such as Plasma Enhanced Chemical Vapor Deposition (PECVD), spinning on, or sputtering, depending on the materials selected to form the various layers of the inventive MEMS microstructure.

Deposited and patterned on top of the second insulation layer 19, using a LPCVD technique, is a first conductive layer of material, such as polysilicon, to form the bottom electrode 20 of the ink ejector 17 and the center conductor 38 of each shielded conductor 32. One skilled in the art will recognize that an additional step of etching is required to form the bottom electrode 20 and the center conductor 38. The processing steps associated with fabricating the shielded conductor 32 will be discussed in more detail below.

A third layer of insulating material is deposited over the first conductive layer using a Plasma Enhanced Chemical Vapor Deposition (PECVD) technique. The third layer of insulating material is a sacrificial layer of material, such as Phoso-Silicate Glass (PSG). This third layer of insulating material, once patterned and etched, forms the dielectric 36 surrounding the center conductor 38 of each shielded conductor 32. One skilled in the art will recognize that one or more annealing operations may be introduced at logical points in the micro-fabrication process to reduce stress in the polysilicon material and to increase the conductivity of any polysilicon in contact with an insulating layer of PSG.

Deposited and patterned over the third layer of insulating material that forms the dielectric 36 is a second layer of conductive material. The material for the second conductive layer may be a silicon material such as polysilicon. The second layer of conductive material forms the inkjet ejector drumhead 22 of the inkjet ejector 17, the outer conductor 34 of each shielded conductor 32, and the ink cavity ink filter 16. One skilled in the art will recognize that the shielded conductors 32 may have a single uniform outer conductor 34 that encapsulates all adjacent center conductors. For example, with reference to FIG. 1, the gap depicted between each outer conductor 34 may be filled with the same material used to form the outer conductor. In this manner, each outer conductor 34 is at the same potential and serves to avoid ground loops in the MEMS apparatus.

In order to form the ink inlet 14 in the first insulation layer 18 and the second insulation layer 19 are patterned from the backside of the structural substrate 12 to create multiple windows for a through wafer KOH etch. The KOH etch on the backside of the structural substrate 12 forms the tapered ink inlet 14.

A layer of photoresist is spun onto the second conductive layer of material and is subsequently patterned and etched. A layer of polyimide is deposited on top of the photoresist to form the ink ejector nozzle plate 30, which also defmes the walls of the ink cavity 26. To form the ink cavity 26, the photoresist is removed leaving an air gap under the ink ejector nozzle plate 30. An additional layer of polyimide is spun onto the top of the ink ejector nozzle plate 30, and patterned and etched to create the ink ejector nozzle 28.

In operation, the shielded conductors 32 are each coupled to an individual ink ejector 17. The center conductor 38 of each shielded conductor 32 carries an excitation signal to the bottom electrode 20 of the ink ejector 17. The excitation signal places an electrostatic charge on the bottom electrode 20 that causes the inkjet drumhead 22 to be placed in close proximity with the bottom electrode 20. The pull down increases the volume of the ink cavity 26 allowing additional ink to enter through the ink inlet 14. When the excitation signal is removed from the bottom electrode 20, the electrostatic charge dissipates allowing the inkjet drumhead 22 to return to its rest position. Because of the ink volume increase caused by the inkjet drumhead 22 pull down, a fraction of the increased ink volume is driven out of the ink ejector nozzle 28 when the excitation signal is removed from the bottom electrode 20.

As illustrated in FIG. 1, each center conductor 38 serves as the conductive path that carries the excitation signal to each bottom electrode 20. Each center conductor 38 is encapsulated by the dielectric 36, which is encapsulated by the outer conductor 34. As a result, each center conductor 38 has at least two layers of material separating the excitation signal from the conductive fluid, for example a conductive ink filling the ink cavity 26. Further, because the conductive fluid is in contact with the outer conductor 34, which is commonly coupled to ground, the outer conductor 34 prevents the build-up of electrostatic charge in the ink cavity 26 that may otherwise interfere with the operation of the inkjet printhead. In addition, having the outer conductor 34 coupled to ground and in contact with a conductive fluid advantageously alleviates the potential for an explosive reaction caused by an electrostatic discharge in the presence of a volatile conductive fluid.

Moreover, because speed is a primary figure of merit for a MEMS apparatus, such as an inkjet drop ejector, high frequency excitation signals are commonly utilized. To gain even higher levels of performance from the inkjet drop ejector, the high frequency excitation signal can be modulated. As a result, the adjacent conductive paths in the inkjet printhead become susceptible to electromagnetic interference (EMI). Nevertheless, because each center conductor 38 has a dielectric layer 36 and an outer conductor 32, that provides the necessary shielding to protect the center conductor 38 from sources of EMI.

Figure 2:
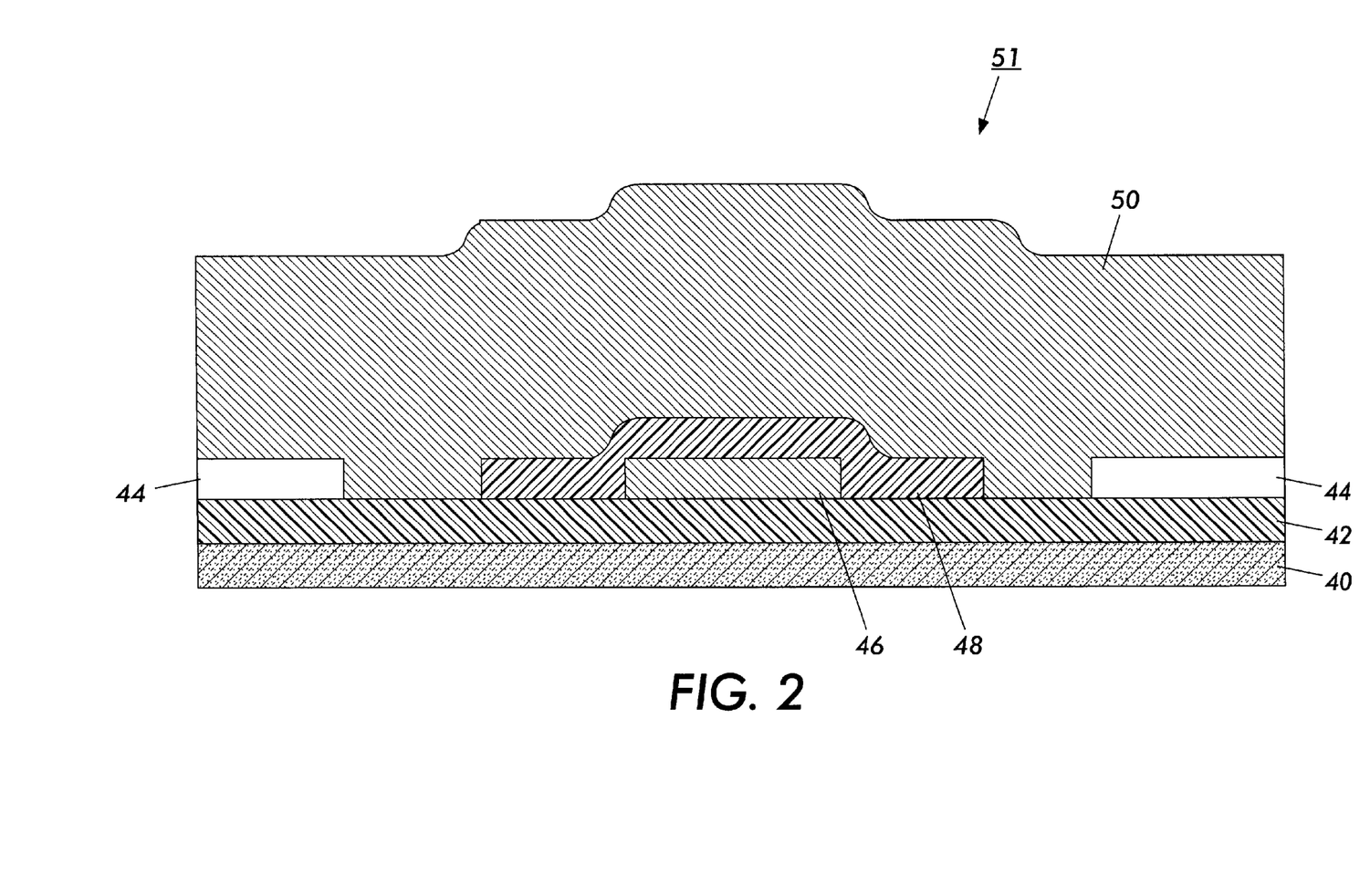
FIG. 2 depicts a cross-sectional view of a shielded conductor according to the teachings of the present invention.

The microfabricated MEMS microstructure depicted by FIG. 2 is a cross section of a shielded conductor 51 having an inner or center conductor and an outer or shielded conductor separated by a dielectric. The shielded conductor 51 includes a base or structural substrate 40 of either a conductive material or a semi-conductive material. Typical materials utilized for the structural substrate 40 include silicon, quartz, glass, silicon nitride, and forms of aluminum oxide such as sapphire, diamond or gallium arsenate. Nonetheless, one skilled in the art will recognize that the structural substrate 40 may be formed of any material capable of surviving a full micro-fabrication process.

Layered on top of the substrate 40 is a first insulation layer 42 of a material exhibiting dielectric properties, such as silicon nitride or an oxide material. Layered on top of the first insulation layer 42 is a first conductive layer 46 of a conductive material that forms the center conductor of the shielded conductor 51. The conductive material utilized as the first conductive layer 46 may be any suitable conductive material such as polysilicon, gold, or the like. Layered on top of the first conductive layer 46 is a second insulation layer 48 that forms the dielectric between the center conductor and the outer conductor. The insulation material utilized as the second insulation layer 48 may be any suitable dielectric material, such as Phospho-Silicate Glass (PSG) or silicon nitride.

Layered on top of the second insulation layer 48 is the second conductive layer 50 that forms the outer conductor of the shielded conductor 51. The conductive material utilized for the second conductive layer 50 may be any suitable conductive material such as polysilicon or a like material. The second conductive layer 50 also fills the channels etched into the second insulation layer 48 thereby encapsulating the center conductor of the shielded conductor 51 on three sides.

An air gap 44 is provided to allow a neighboring mechanical element sufficient room to flex, rotate, slide, or the like. One skilled in the art will recognize that the air gap is an optional microstructure of the shielded conductor 51. The method for forming the shielded conductor 51 will be discussed in more detail below with reference to FIG. 3.

In operation, the shielded conductor 51 functions as a coaxial conductor shielding the inner conductor from the environment in which the MEMS apparatus is deployed. The second conductive layer 50 functions as a screen to protect the signal being propagated along the first conductive layer 46 from external interference such as EMI and conductive fluids as well as, to prohibit the radiation of the propagated signal outwards. The second conductive layer 50 is typically coupled to ground to provide an infinite sink for stray electromagnetic energy, and in the case of conductive fluids for electrostatic energy.

Although the shielded conductor 51 lacks a conductive shield that fully encapsulates the center conductor, nonetheless, the shielded conductor 51 functions as a coaxial conductor in certain applications. For example, in a MEMS apparatus that has a single layer of embedded circuitry there exists no embedded circuitry above or below that could emit an electromagnetic field or be susceptible to electromagnetic interference. In this manner, having a conductive shield on three sides of the center conductor provides sufficient protection to counter the effects of EMI from adjacent conductive paths. While one skilled in the art will recognize that any opening in the shield of a shielded conductor will diminish the shield's effectiveness, the shield boundary of the shielded conductor 51 is sufficient for printhead applications.

Since shielded conductor 51 may be utilized to prevent electromagnetic interference from one or more adjacent conductive paths formed in a single layer of a MEMS apparatus, the conventional burden of routing conductive paths through a MEMS apparatus, such as an electrostatic inkjet printhead, is abated. The risk of having an adjacent conductive path or electronic element induce an electromagnetic pulse on the center conductor is greatly reduced. As a result, the MEMS apparatus is less susceptible to electromagnetic interference. Furthermore, the formation of the shielded conductor 51 requires no additional processing steps; moreover, no additional labor or material expenses are incurred during the micro-fabrication process.

Figure 3:
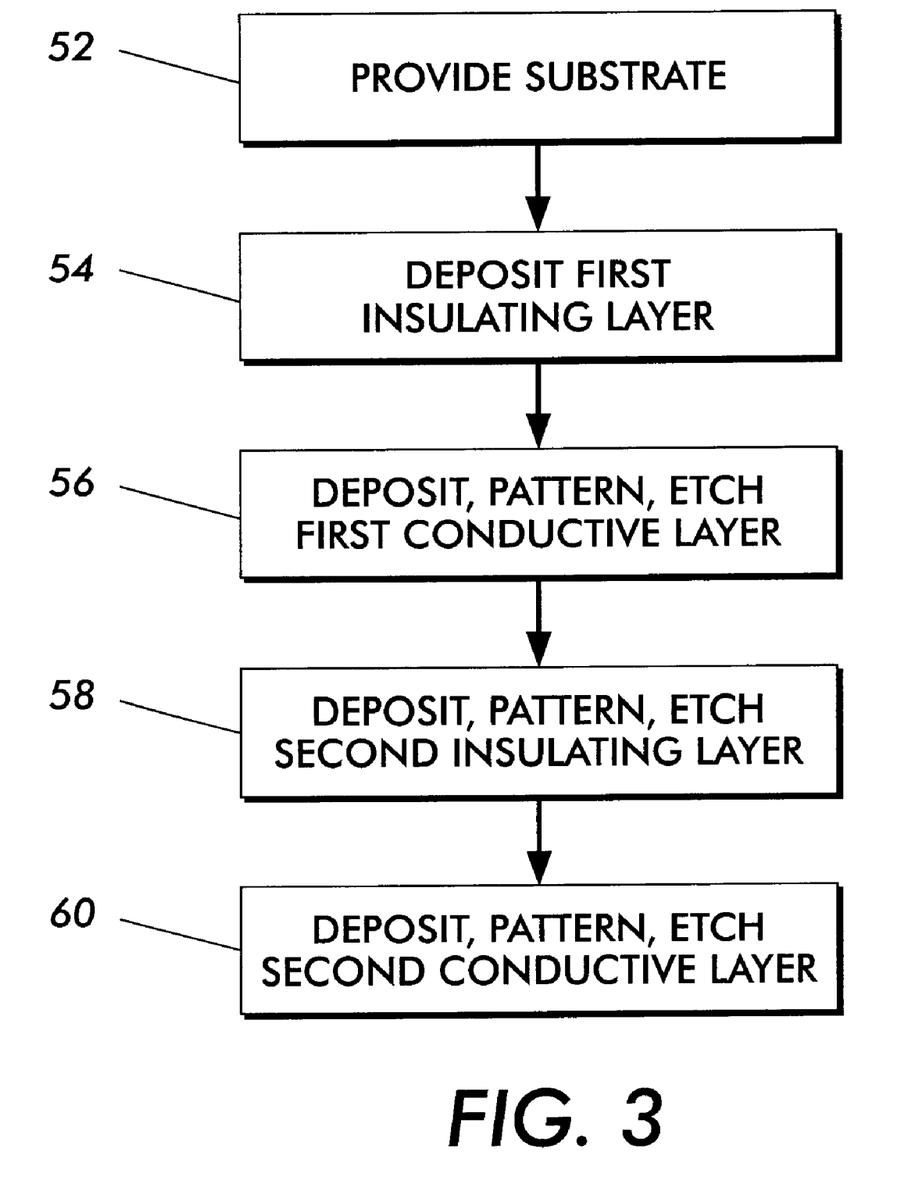
FIG. 3 is a schematic flow chart diagram depicting the steps taken to fabricate the conductor of FIG. 2.

FIG. 3 illustrates the steps taken to fabricate the shielded conductor 51 illustrated in FIG. 2. To begin the process a base or substrate 40 of conducting or semi-conducting material is provided (step 52) and is covered with a dielectric material to form first insulation layer 42 (step 54). The first insulation layer 42 may be of an insulating material, such as silicon nitride or thermal oxide, that is deposited or grown on the substrate to form a dielectric layer having a thickness of between about 0.5 microns and between about 1.0 microns. If the first insulation layer 42 is a thermal oxide material, the first insulation layer 42 is grown in an oven. If the first insulation layer 42 is a silicon nitride material or other similar material, the first insulation layer 42 is deposited. The deposition process is a dry deposition process using a Low Pressure Chemical Vapor Deposition (LPCVD) method.

A first conductive layer 46 of material is a conductive material, such as polysilicon is deposited over the first insulation layer 42 using an LPCVD method (step 56). The first conductive layer 46 may have a thickness of between about 0.5 microns and between about 3 microns. Once the first conductive layer 46 is deposited, it is patterned and etched to form and define the center conductor of the shielded conductor 51.

Once the center conductor has been formed, a second insulation layer 48 of an insulating material, such as Phospho-Silicate Glass (PSG) is deposited using a Plasma Enhanced Chemical Vapor Deposition process (PECVD) over the first conductive layer 42 (Step 58). One skilled in the art will appreciate that a LPCVD deposition process may be utilized to deposit the first conductive layer 42. The second insulation layer 48 forms the dielectric that separates the center conductor and the outer conductor in the shielded conductor 51. The second insulation layer 48 is patterned and etched to form a channel or trench along each side of the center conductor formed in the first conductive layer 46 (step 58). The second insulation layer 48 may have a thickness of between about 0.5 microns and between about 3.0 microns.

Deposited over the second insulation layer 48, using a LPCVD deposition process, is a second conductive layer 50 having a thickness of between about 0.5 microns and between about 3.0 microns (step 60). The second conductive layer 50 fills the channels or trenches formed above in the second insulation layer 48 (step 60). The second conductive layer 50 is a conductive material, such as polysilicon that forms the outer conductor or shield that encapsulates the second insulation layer 48 on three sides. The second conductive layer 50 is patterned and etched to define the top width and the sides of the outer conductor of the shielded conductor 51 (Step 60).

One skilled in the art will recognize that additional processing steps may be added to the above described method for forming a shielded conductor without departing from the scope of the present invention. For example, depending on the types of materials selected to form an insulation layer or dielectric layer, a high temperature bake may occur after the deposition of the second insulation layer 48 or after the deposition of the second conductive layer 50. In particular, if a Phospho-Silicate Glass material is utilized as an insulation layer, and polysilicon is used as a first or second conductive layer, the high temperature bake provides a two part benefit. First the bake anneals the inherent stress out of the polysilicon layers and second, dopes the polysilicon layers with additional phosphorus to increase the conductivity of any polysilicon in contact with the PSG.

In addition, a layer of PSG approximately 0.2 microns thick may be deposited after each polysilicon deposition layer of more than a micrometer. Then during any photoresist operation, the pattern that is created is transferred to the PSG by performing an oxide etch. As a result, during any etch of the polysilicon underneath, the oxide acts as a better protective layer than the photoresist to protect the polysilicon during etching.

Figure 4:
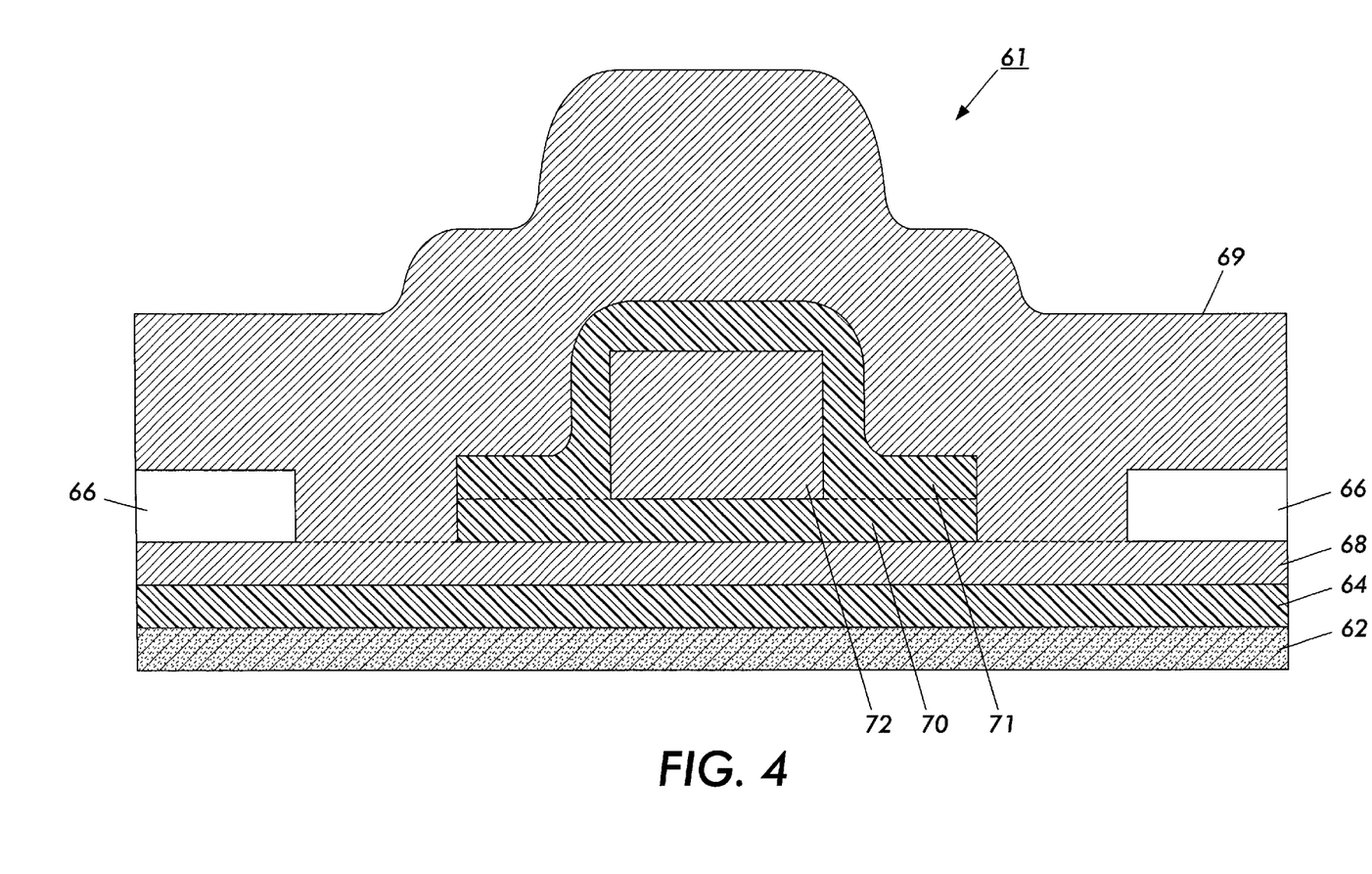
FIG. 4 depicts a cross-sectional view of an alternate embodiment of the shielded conductor according to the teachings of the present invention.

The microfabricated MEMS microstructure depicted in FIG. 4 is a cross-section of the shielded conductor 61. The microstructure provides shielded conductor 61 an inner or center conductor, an outer or shielded conductor, and a dielectric that separates the two conductors. The shielded conductor 61 includes a base or structural substrate 62 of either a conductive material or a semi-conductive material. Typical materials utilized for structural substrate 62 include silicon, quartz, glass, silicon nitride, and forms of aluminum oxide such as sapphire, diamond or gallium arsenate. Nonetheless, one skilled in the art will recognize that the structural substrate 62 may be any material capable of surviving a full micro-fabrication process.

Layered on top of the structural substrate 62 is the first insulation layer 64. The first insulation layer 64 is composed of a material that exhibits dielectric properties, such as silicon nitride or an oxide material. Layered over the first insulation layer 64 is a first conductive layer 68 of a conductive material that forms the bottom portion of the outer conductor in the shielded conductor 61. The conductive material utilized as the first conductive layer 68 may be any suitable conductive material such as polysilicon, gold, or the like. Layered on top of the first conductive layer 68 is a second insulation layer 70 that forms the dielectric barrier between the bottom portion of the center conductor and the bottom portion of the outer conductor. The insulation material utilized as the second insulation layer 70 may be any suitable dielectric material such as Phospho-Silicate Glass (PSG).

Layered on top of the second insulation layer 70 is the second conductive layer 72 that forms the inner conductor of the shielded conductor 61. The conductive material utilized as the second conductive layer 72 may be any suitable conductive material, such as polysilicon or a like material. Layered over the second conductive layer 72 is a third insulation layer 71 to form the dielectric separating the side portions and the top portion of the center conductor from the outer conductor. Layered over the third insulation layer 71 is the third conductive layer 69 to form the outer conductor of the shielded conductor 61. The third conductive layer 69 encapsulates the top and the sides of the third insulation layer 71. In this manner, the third conductive layer 69 and the first conductive layer 68 form a seamless shield around the second conductive layer 72 also referred to as the center conductor of the shielded conductor 61.

An air gap 66 is provided to allow a neighboring mechanical element sufficient room to flex, rotate, slide, or the like. One skilled in the art will recognize that the air gap 66 is an optional microstructure of the shielded conductor 61. The method for forming the shielded conductor 61 will be discussed in more detail below with reference to FIG. 5.

In operation, the shielded conductor 61 functions as a coaxial conductor shielding the inner conductor from the environment in which the MEMS apparatus is deployed. The first conductive layer 68 and the third conductive layer 69 function to shield the signal being propagated along the second conductive layer 72 from external interference, from conductive fluids, and to prevent outward radiation of the propagated signal. The first conductive layer 68 and the second conductive layer 69 are typically coupled to an earth ground to provide an infinite sink for stray electromagnetic energy and/or electrostatic energy in the case of conductive fluids.

Since shielded conductor 61 may be utilized to prevent electromagnetic interference from effecting one or more conductive paths formed in a MEMS apparatus, the conventional burden of routing conductive paths through a MEMS apparatus, such as an electrostatic inkjet printhead, is abated. The risk of having a conductive path or electronic element induce an electromagnetic pulse on the center conductor is greatly reduced. As a result, the MEMS apparatus is less susceptible to electromagnetic interference. In addition, the formation of the shielded conductor 61 requires no additional processing steps; moreover, no additional labor or material expenses are incurred during the microfabrication process.

Figure 5:
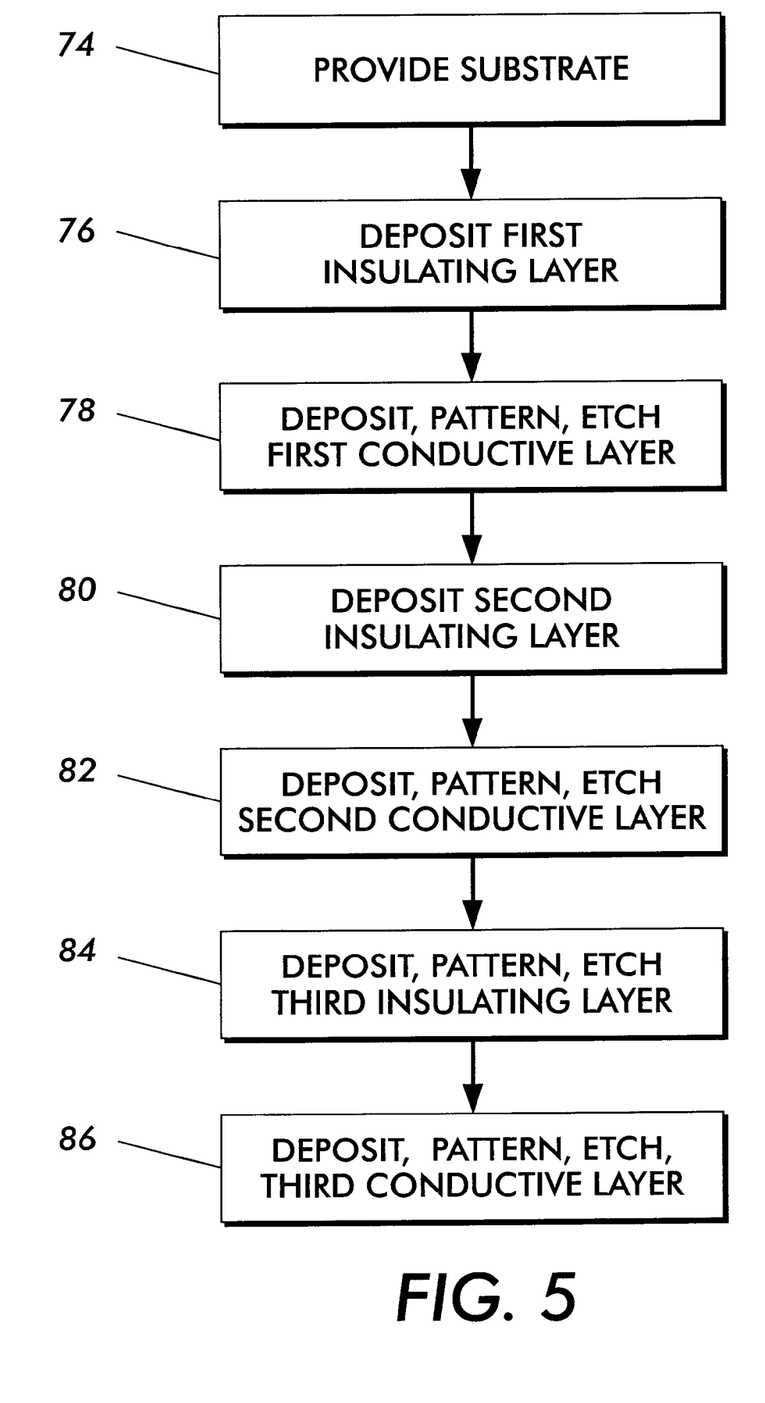
FIG. 5 is a schematic flow chart diagram depicting the steps taken to fabricate the shielded conductor of FIG. 4.

FIG. 5 illustrates the steps taken to fabricate the shielded conductor 61 illustrated in FIG. 4. To begin the process a base or substrate 62 of conducting or semi conducting material is provided (step 74) and is subsequently covered with a first insulation layer 64. The first insulation layer 64 may be formed using a dielectric material, such as silicon nitride or thermal oxide. Depending on the material selected, the first insulation layer 64 is deposited or grown on the substrate 62 (step 76) to form a dielectric layer having a thickness of between about 0.5 microns and between about 1.0 microns. If the first insulation layer 64 is a thermal oxide material, the first insulation layer 64 is grown in an oven. If the first insulation layer 64 is a silicon nitride material or other similar material the first insulation layer 64 must be deposited, patterned, and etched. The deposition process for the first insulation layer 64 is a dry deposition process using a Low Pressure Chemical Vapor Deposition (LPCVD) technique.

A first conductive layer 68 is deposited using an LPCVD method over the first layer of insulating material. The first conductive layer 68 may be formed with a conductive material, such as polysilicon or other like material. The first conductive layer 68 may have a thickness of between about 0.5 microns and between about 3.0 microns. Once the first conductive layer 68 is deposited, it is patterned and etched to form and define the bottom portion of the outer conductor in shielded conductor 61 (step 78).

Once the bottom portion of the outer conductor has been formed, a second insulation layer 70 of an insulating material, such as Phospho-Silicate Glass (PSG) or other like material, is deposited using a Plasma Enhanced Chemical Vapor Deposition process (PECVD) over the first conductive layer 68 (Step 80). The second insulation layer 70 forms the bottom portion of the dielectric that separates the bottom portion of the center conductor from the bottom portion of the outer conductor in the shielded conductor 61. The second insulation layer 70 is not patterned or etched at this point in the process, because its presence is necessary as an etch stop, so that the conductive layer 68 is not etched during the etching of the conductive layer 72. The second insulation layer 70 may have a thickness of between about 0.5 microns and between about 1.0 microns.

Deposited over the second insulation layer 70 using a LPCVD deposition process, is a second conductive layer 72 of a conductive material, such as polysilicon or other like material. The second conductive layer 72 is formed to have a thickness of between about 0.5 microns and between about 3.0 microns. The second conductive layer 72 is patterned and etched to define the center conductor of the shielded conductor 61 (step 82). One skilled in the art will recognize that an overetch of the second conductive layer 72 is preferred to ensure that the material is completely removed in areas where a prior processing step increased the film thickness.

Deposited over the second conductive layer 72 is an insulating material, such as PSG or other like material, to form the third insulation layer 71. The PECVD deposition process utilized to deposit the third insulation layer 71 provides a layer of insulating material having a thickness between about 0.5 microns and between about 2.0 microns. At this point the second insulation layer 70 and the third insulation layer 71 are patterned and etched to form the dielectric structure that separates the center conductor from the outer conductor. The second insulation layer 70 and the third insulation layer 71 are also patterned and etched to form a channel or trench along each side of the center conductor formed by the second conductive layer 72 (step 84).

Layered over the third insulation layer 71 using a LPCVD deposition technique is a third conductive layer 69 that also fills the channels or trenches formed above, to form the top and sides of the outer conductor of shielded conductor 61 (Step 86). The third conductive layer 69 may be formed of a conductive material, such as polysilicon or other like materiaL The third conductive layer 69 may have a thickness of between about 0.5 microns and between about 3.0 microns. As part of the deposition process, the third conductive layer 69 is patterned and etched to define the width of the top of the outer conductor (step 86).

One skilled in the art will recognize that additional processing steps may be added to the above described method for forming a shielded conductor without departing from the scope of the present invention. For example, depending on the types of materials selected to form the insulating or dielectric layers, a high temperature bake may occur after the deposition of the insulating layers. In particular, if a Phospho-Silicate Glass material is utilized as an insulation layer, and polysilicon is used as a conductive layer, the high temperature bake provides a two part benefit. First the bake anneals the inherent stress out of the polysilicon layer and second, dopes the polysilicon layer with additional phosphorus to increase the conductivity of any polysilicon in contact with the PSG.

In addition, a layer of PSG approximately 0.2 microns thick may be deposited after each polysilicon deposition layer of more than a micrometer. Then during any photoresist operation, the pattern that is created is transferred to the PSG by performing an oxide etch. As a result, during any etch of the polysilicon underneath, the oxide acts as a better protective layer than the photoresist to protect the polysilicon during etching.

Figure 6:
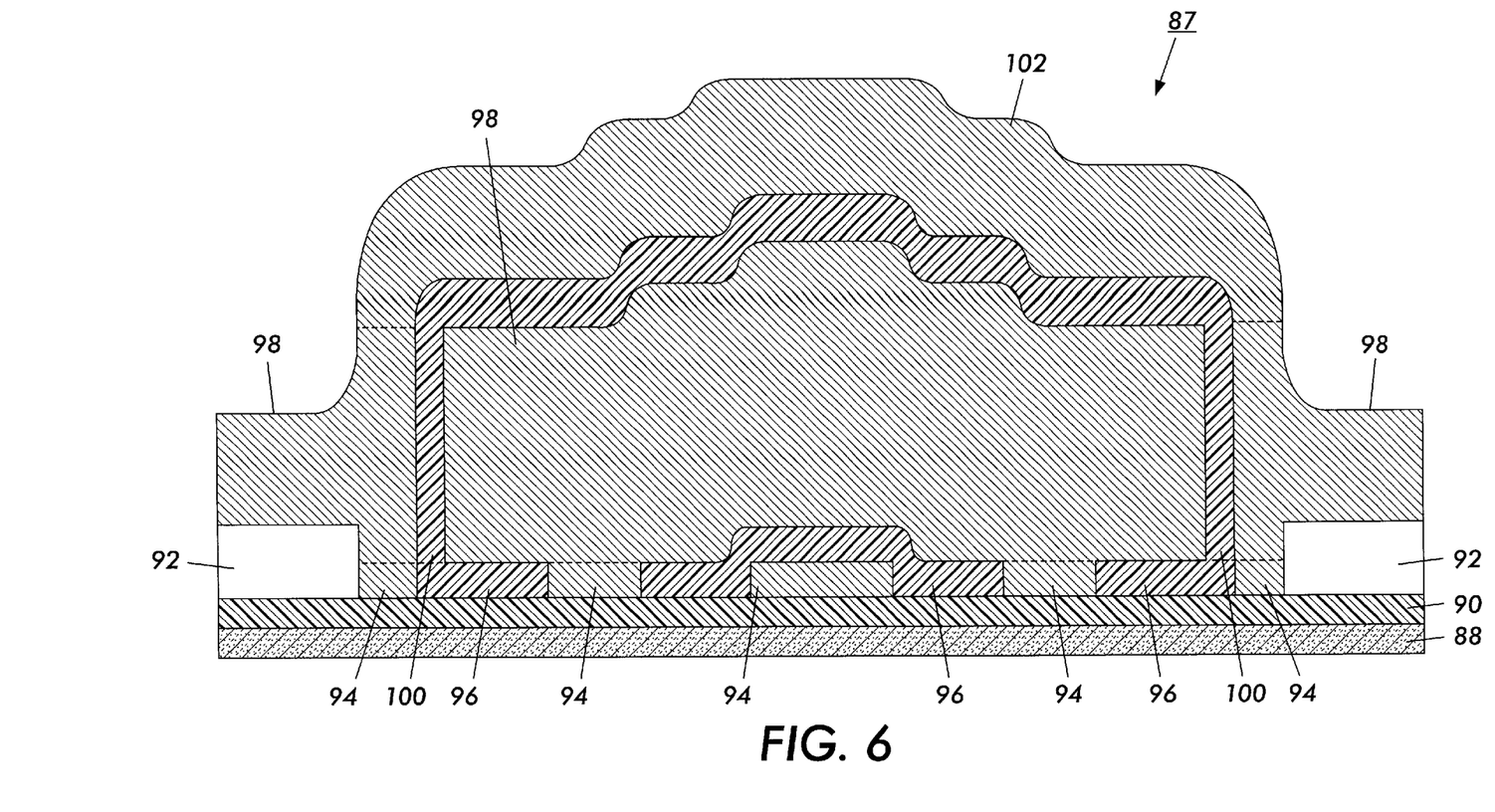
FIG. 6 depicts a cross-sectional view of another embodiment of the shielded conductor according to the teachings of the present invention.

The micro-fabricated MEMS microstructure depicted by FIG. 6 is a cross section of the shielded conductor 87. The microstructure allows the shielded conductor 87 to have an inner or center conductor, a first shielded conductor, a second shielded conductor, and a dielectric that separates each conductive layer. The shielded conductor 87 includes a base or structural substrate 88. Either a conductive material or a semi-conductive material is suitable for use as the structural substrate 88. Typical materials utilized for structural substrate 88 include silicon, quartz, glass, silicon nitride, and forms of aluminum oxide such as sapphire, diamond or gallium arsenate. Nonetheless, one skilled in the art will recognize that the structural substrate 88 may be any material capable of surviving a full micro-fabrication process.

Layered on top of the structural substrate 88 is a first insulation layer 90 of a material exhibiting dielectric properties, such as silicon nitride or an oxide material. Layered on top of the first insulation layer 90 is a first conductive layer 94 of a conductive material that forms the center conductor and the bottom portion of the first shielded conductor and the bottom portion of the second shielded conductor of the shielded conductor 87. The conductive material utilized as the first conductive layer 94 may be any suitable conductive material such as polysilicon, gold, or the like. Layered on top of the first conductive layer 94 is a second insulation layer 96 that forms the dielectric between the center conductor and the first shielded conductor. The insulation material utilized as the second insulation layer 96 may be any suitable dielectric material, such as Phospho-Silicate Glass (PSG) or similar material. The second insulation layer 96 encapsulates the top and the sides of the center conductor and settles into channels or trenches formed in the first conductive layer 94 during the micro-fabrication process.

Layered on top of the second insulation layer 94 is the second conductive layer 98 that forms the top portion of the first shielded conductor and a portion of the side walls for the second shielded conductor. The second conductive layer 98 is patterned and etched during the micro-fabrication process to form a channel or trench on each side of the center conductor that couples to the channels or trenches filled by the second insulation layer 96. The conductive material utilized as the second conductive layer 98 may be any suitable conductive material such as polysilicon or like material.

Layered over the second conductive layer 98 and filling the channels formed in the second conductive layer 98 is a third insulation layer 100 to form the top and side portions of the dielectric layer that separates the first shielded conductor from the second shielded conductor of the shielded conductor 61. Layered over the third insulation layer 100 is the third conductive layer 102 to form the top portion of the second shielded conductor of the shielded conductor 61. The third conductive layer 102 encapsulates the top of the third insulation layer 100 and is in structural and electrical contact with the portion of the second conductive layer 98 that forms the side walls of the second shielded conductor.

An air gap 92 is provided to allow a neighboring mechanical element sufficient room to flex, rotate, slide, or the like. One skilled in the art will recognize that the air gap 92 is an optional microstructure of the shielded conductor 87. The method for forming the shielded conductor 87 will be discussed in more detail below with reference to FIG. 7.

In operation, the shielded conductor 87 acts as a triaxial conductor having the second shielded conductor coupled to ground while having the center conductor and the first shielded conductor coupled to a signal source. In this manner, a low capacitance signal path having an input capacitance on the order of a pico-farad may be utilized to drive a MEMS apparatus. Conventional signal paths utilized to drive a MEMS apparatus typically exhibit an input capacitance on the order of a microfarad. Because the capacitance of the signal path is significantly greater than that of the MEMS apparatus, the majority of the charge intended for the MEMS apparatus is drawn off by the relatively high capacitance signal path.

Utilization of the shielded conductor 87 minimizes the amount of signal charge drawn off when transmitting signal to and from the MEMS apparatus. In operation, the center conductor and the first shield of the shielded conductor 87 are coupled to the signal source. Because both conductors are coupled to the source, they are both at the same potential and hence, bypass the capacative effects of the dielectric. Although the outer conductor is coupled to ground, or acts as a return, there still exists a capacitance between the first shielded conductor and the second shielded conductor. However, because the dielectric is bypassed between the center conductor and the first shielded conductor, the center conductor exhibits a negligible capacitance relative to the second shielded conductor allowing nearly a full signal charge to pass to the MEMS apparatus.

The shielded conductor 87 also provides the benefits associated with the shielded conductor 51 and the shielded conductor 61 discussed in detail above. For example, shielding the center conductor from the effects of electromagnetic interference, contact with conductive fluids, prevention of outward radiation from the propagated signal.

Since the shielded conductor 87 may be utilized to prevent electromagnetic interference form one or more conductive paths formed in a single layer of a MEMS apparatus, the conventional burden of routing conductive paths through a MEMS apparatus, such as an electrostatic inkjet printhead, is abated. The risk of having an adjacent conductive path or electronic element induce an electromagnetic pulse on the center conductor is greatly reduced. As a result, the MEMS apparatus is less susceptible to electromagnetic interference. In addition, the formation of the shielded conductor 87 requires no additional processing step; moreover, no additional labor or material expenses are incurred during the micro-fabrication process.

Figure 7:
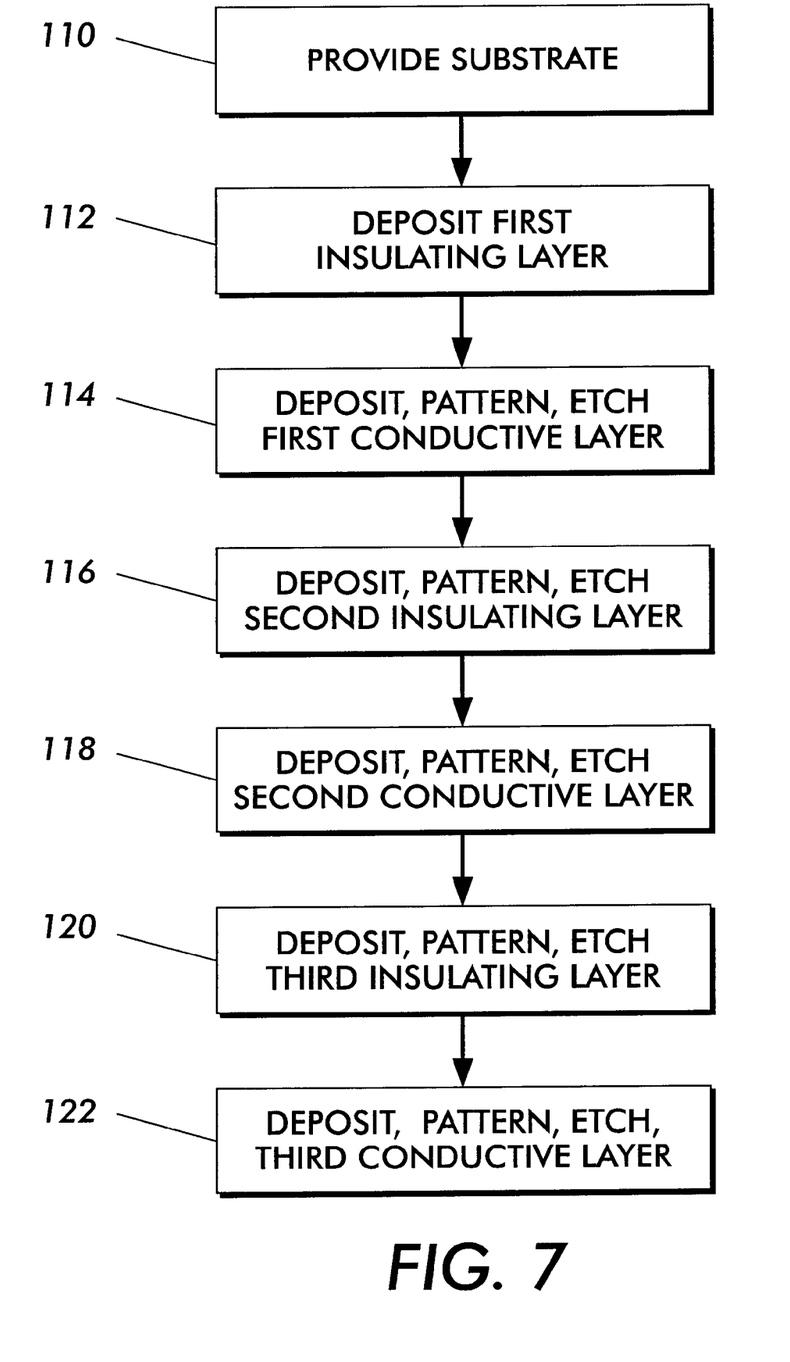
FIG. 7 is a schematic flow chart diagram illustrating the steps performed to fabricate the conductor of FIG. 6.

FIG. 7 illustrates the steps taken to fabricate the shielded conductor 87 illustrated in FIG. 6. To begin the process a base or substrate 88 of conducting or semi conducting material is provided (step 110) and is subsequently covered with a first insulation layer 90 (step 112). The first insulation layer 90 may be formed of an insulating material, such as silicon nitride or thermal oxide. The first insulation layer 90 is deposited or grown on the substrate 88 to form a dielectric layer having a thickness of between about 0.5 microns and between about 1.0 microns. If the first insulation layer 90 is a thermal oxide material, the first insulation layer 90 is grown in an oven. If the first insulation layer 90 is a silicon nitride material or other similar material the first insulation layer 90 must be deposited, patterned, and etched. The deposition process is a dry deposition process using a Low Pressure Chemical Vapor Deposition (LPCVD) technique.

A first conductive layer 94 of a conductive material, such as polysilicon or other similar material is deposited, using an LPCVD method, over the first insulation layer 90 (step 114). The first conductive layer 94 may have a thickness of between about 0.5 microns and between about 3.0 microns. Once the first conductive layer 94 is deposited, the layer is patterned and etched to form and define the center conductor, a bottom portion of the first conductive shield, and a bottom portion of the second conductive shield of the shielded conductor 87 (step 114).

Once the center conductor and the bottom portions of the first and second conductor shield are formed, a second insulation layer 96 of an insulating material, such as Phospho-Silicate Glass (PSG) or other similar material, is deposited using a Plasma Enhanced Chemical Vapor Deposition process (PECVD) over the first conductive layer 94. The second insulation layer 96 is patterned and etched to encapsulate the top portion and the side portions of the center conductor, and to fill the channels or the trenches between the bottom portions of the first and second shielded conductors (step 116). The second insulation layer material 96 may have a thickness of between about 0.5 microns and between about 1.0 microns.

Using a LPCVD deposition process a second conductive layer 98 of a conductive material, such as polysilicon or other similar material, is deposited over the second insulation layer 96. The thickness of the second conductive layer 98 is between about 0.5 microns and between about 3.0 microns. The second conductive layer 98 is patterned and etched to define the top portion of the first shielded conductor and to form a channel or trench on each side of the center conductor to define the side wall portions of the second shielded conductor (step 118).

Deposited over the second conductive layer 98 using a PECVD deposition process, is a third insulation layer 100 of an insulating material such as PSG or other similar material. The PECVD deposition process provides a third insulation layer 100 having a thickness of between about 0.5 microns and between about 2.0 microns. The third insulation layer 100 is patterned and etched to form the dielectric structure that encapsulates the top portion and the side portions of the first shielded conductor to separate the first shielded conductor from the second shielded conductor (step 120).

Layered over the third insulation layer 100, using a LPCVD deposition technique, is a third conductive layer 102 of a conductive material that forms the top portion of the outer shielded conductor. The third conductive layer 102 may be of a conductive material, such as polysilicon or similar material. The third conductive layer 102 may have a thickness of between about 0.5 microns and between about 3.0 microns. The third conductive layer 102 is patterned and etched to define the width of the top of the second shielded conductor (step 122).

One skilled in the art will recognize that additional processing steps may be added to the above described method for forming a shielded conductor without departing from the scope of the present invention. For example, depending on the types of materials selected to form the insulating or dielectric layers, a high temperature bake may occur after the deposition of an insulating layer. In particular, if a Phospho-Silicate Glass material is utilized as the material to form the insulation layer, and polysilicon is the material used to form a conductive layer, the high temperature anneal provides a two part benefit. First, the anneal removes the inherent stress out of the polysilicon layer, and second, the anneal dopes the polysilicon layer with additional phosphorus to increase the conductivity of any polysilicon in contact with the PSG.

In addition, a layer of PSG approximately 0.2 microns thick may be deposited after each polysilicon deposition layer of more than a micrometer. Then during any photoresist operation, the pattern that is created is transferred to the PSG by performing an oxide etch. As a result, during any etch of the polysilicon underneath, the oxide acts as a better protective layer than the photoresist to protect the polysilicon during etching.

Those skilled in the art will recognize that the shielded conductor 87 may be formed in a fashion similar to the formation of the shielded conductor 61. In this manner, either or both of the shielded conductors in the shielded conductor 87 may have a bottom portion to form a continuous shield without any openings.

Those skilled in the art will appreciate that the applications of the above described shielded conductors are not limited solely to MEMS utilized as printheads for an image forming device. For example, the shielded conductor may be employed by a MEMS apparatus for detecting hazardous chemicals and biological agents, for manipulating light, for processing and manufacturing chemical and biological compounds and materials, such as Microsystems for high through put drug screening and selection.

While the present invention has been described with reference to an illustrative embodiment thereof those skilled in the art will appreciate that various changes in form and detail may be made without departing from the intended scope of the present invention as defined in the appended claims.

What is claimed is:

1. A microfabricated electro-mechanical system (MEMS) microstructure forming an electrical connection comprising:
   a first layer of conductive material disposed on a substrate to form a conductive pathway;
   a first layer of dielectric material disposed over said first layer of conductive material to encapsulate said conductive material; and
   a shield layer of conductive material disposed over said first layer of dielectric material, the shield layer arranged to shield the first layer of conductive material on three sides.

2. The MEMS microstructure of claim 1, further comprising a layer of dielectric material disposed between said substrate and said first layer of conductive material.

3. The MEMS microstructure of claim 1, further comprising
   a second layer of dielectric material in contact with said second layer of conductive material to encapsulate said second layer of conductive material; and
   a third layer of conductive material over said second layer of dielectric material to form an outer shield.

4. The MEMS microstructure of claim 3, further comprising a layer of dielectric material disposed between said substrate and said first layer of conductive material.

5. The MEMS of claim 1, further comprising:
   a printhead for an image forming system, the MEMS being incorporated in the printhead.

6. The MEMS microstructure of claim 1, wherein the dielectric material contacts the first layer of conductive material on three sides.

7. The MEMS microstructure of claim 1, further comprising a second layer of dielectric material to envelop the second layer of conductive material with said dielectric material.

8. The MEMS microstructure of claim 1, further comprising a third layer of conductive material disposed over said second layer of dielectric material to form an outer shield.

9. The MEMS microstructure of claim 8, further comprising a layer of dielectric material disposed between said substrate and said first layer of conductive material.

10. The MEMS microstructure of claim 1, further comprising a center conductor formed of said second layer of conductive material being encapsulated by dielectric material.

11. The MEMS microstructure of claim 1, further comprising
    a second layer of dielectric material disposed over said second layer of conductive material to enshroud said second layer of conductive material; and
    a third layer of conductive material disposed over said second layer of dielectric material to form an outer shield.

12. The MEMS of claim 1, further comprising:
    a device adapted to sense and control an organic material, wherein the MEMS is incorporated in the device.

13. The MEMS of claim 1, further comprising:
    a device adapted to manipulate light, wherein the MEMS is incorporated in the device.

14. A microfabricated electro-mechanical system (MEMS) microstructure forming an electrical connection comprising:
    a first layer of conductive material disposed on a substrate to form a conductive pathway;
    a first layer of dielectric material disposed over said first layer of conductive material to encapsulate said conductive material;
    a second layer of conductive material disposed over said first layer of dielectric material to form an outer shield; and
    at least one trench in said dielectric material, wherein said second layer of conductive material substantially fills said at least one trench so that a portion of the second layer of conductive material is in a same plane as a portion of the first layer of conductive material.

15. A microfabricated electro-mechanical system (MEMS) microstructure forming an electrical connection comprising:
    a first layer of conductive material disposed on a substrate to form a conductive pathway;

a first layer of dielectric material disposed over said first layer of conductive material to encapsulate said conductive material;

a second layer of conductive material disposed over said first layer of dielectric material to form an outer shield; and a gap between the first layer of dielectric material and said first layer of conductive material.

16. A microfabricated electro-mechanical system (MEMS) microstructure forming an electrical connection comprising:

a first layer of conductive material disposed on a substrate to form a conductive pathway;

a first layer of dielectric material disposed over said first layer of conductive material to encapsulate said conductive material; and a second layer of conductive material disposed over said first layer of dielectric material to form an outer shield;

wherein the second layer of conductive material is patterned so as to contact one of the substrate and an initial layer of dielectric material disposed prior to the first layer of conductive material.

17. A microfabricated electro-mechanical system (MEMS) microstructure forming an electrical connection comprising:

a first layer of conductive material disposed on a substrate to form a conductive pathway;

a first layer of dielectric material disposed over said first layer of conductive material to encapsulate said conductive material;

a second layer of conductive material disposed over said first layer of dielectric material to form an outer shield;

a second layer of dielectric material to envelop the second layer of conductive material with said dielectric material;

a third layer of conductive material disposed over said second layer of dielectric material to form an outer shield; and a gap formed between said first layer of conductive material and said third layer of conductive material.

* * * * *